METHOD OF MAKING LOW RESISTANCE CONTACT TO SILICON SEMICONDUCTOR DEVICE

Filed June 18, 1962

INVENTORS
M. P. LEPSELTER
L. P. MARINACCIO
BY H.W. Lockhart
ATTORNEY

United States Patent Office 3,253,951

Patented May 31, 1966

3,253,951

METHOD OF MAKING LOW RESISTANCE CONTACT TO SILICON SEMICONDUCTOR DEVICE

Louis P. Marinaccio and Martin P. Lepselter, Plainfield, N.J., assignors to Bell Telephone Laboratories, Incorporated, New York, N.Y., a corporation of New York Filed June 18, 1962, Ser. No. 203,116
5 Claims. (Cl. 117—212)

Figure 5:
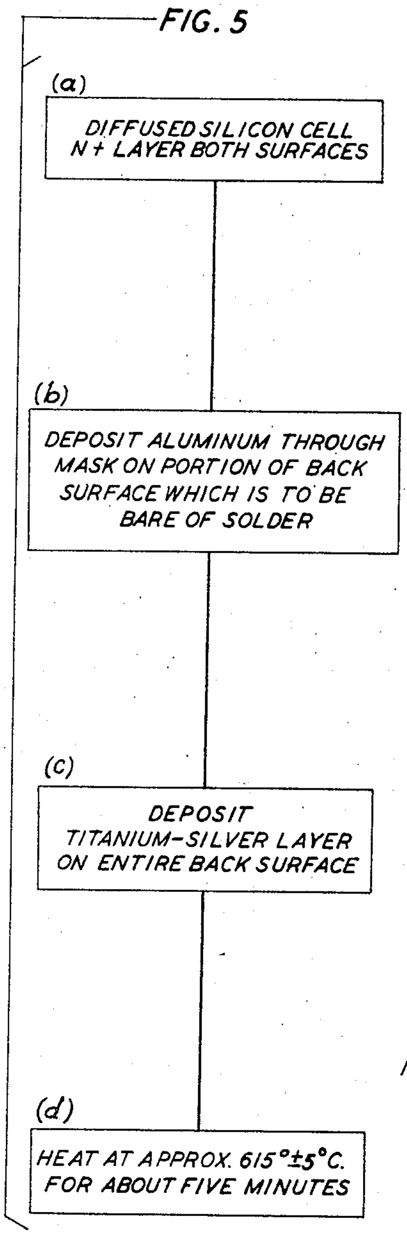

This invention relates to semiconductor devices and more particularly to a method for making large area low resistance connections to conductivity type regions lying beneath shallow, diffused surface layers of opposite conductivity type.

Specifically, this invention is directed to the fabrication of large area electrodes on the surface of a silicon semiconductor device to make electrical connection to an underlying major conductivity type region.

Accordingly, an object of this invention is an improved large area low resistance contact to a silicon semiconductor device of the shallow, diffused junction type.

It is also an object of this invention to improve the process for fabricating such a connection by eliminating or avoiding certain more costly operations.

Typically in fabricating silicon semiconductor devices having shallow, diffused junctions such as solar cells, it is advantageous to diffuse impurities without masking and therefore to produce a slice having shallow conductivity type layers or skins on both surfaces. To produce a single junction device such as a solar cell, it is therefore necessary to remove the conductivity type layer on one surface of the diffused slice before proceeding with the further fabrication steps. This removal is usually accomplished by chemical etching, mechanical lapping or liquid honing, and constitutes a costly and time consuming step as well as one in which the likelihood of contamination of, or damage to, the material is increased.

After the shallow, diffused conductivity type layer has been removed from one side of the slice, it is coated with the titanium-silver electrode in accordance with the method disclosed in application Serial No. 74,872, filed December 9, 1960, and now Patent No. 3,106,489, by M. P. Lepselter, and assigned to the same assignee as this application. On the side having the shallow, diffused junction, which is the light-activated side, this titanium-silver electrode is formed in a comb-like pattern with wide spaced teeth by using a suitable mask during deposition. On the opposite side, to avoid the use of a mask, the titanium-silver is deposited over the entire surface although it may be needed only on limited portions. The slice then is heat treated and divided into cell size wafers. The final major step in the cell fabrication is to dip solder each wafer which tins the titanium-silver coated surfaces. One disadvantageous consequence of this process is the excess amount of solder applied on the inactive surface which may add significant weight to a solar cell powered satellite.

In accordance with this invention, it has been found unnecessary to remove the unwanted conductivity type layer or skin if a thin coating of aluminum is deposited on those portions of the surface of the device from which it is desired to exclude the titanium-silver solder. Following deposition of the aluminum, the titanium and silver coatings are deposited in accordance with the practice referred to above. The assembly then is heat treated which alloys the aluminum through the thin conductivity type surface layer and into the underlying major conductivity type region. In the area where the titanium-silver coating is applied over the aluminum, there is formed, by heat treatment, an untinnable alloy. The titanium-silver coated areas containing no aluminum, on the other hand, are easily tinned. The result is a structure in which the titanium-silver electrode portions are contiguous to, and in contact with, the aluminum-containing alloy portion which itself makes low resistance contact to the major underlying conductivity type portion. Similarly, the final solder coating adheres only to the nonaluminum-containing titanium-silver portions. Accordingly, the step of removing the thin, unwanted diffused layer has been eliminated, and the area of solder application has been reduced without masking the titanium-silver deposition. The consequent savings in weight and material use are apparent.

The invention and its further objects and features will be understood more clearly from the following description taken in connection with the drawing in which:

FIGS. 1 through 4 depict in perspective and partially in section, the structural changes corresponding to the method steps recited in FIG. 5; and FIG. 5 is a flow chart showing steps in the method of this invention.

Figure 1:
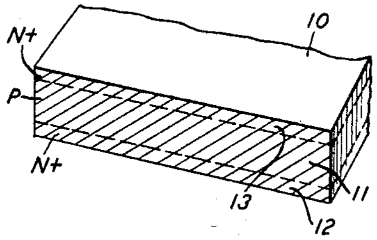
Figure 2:
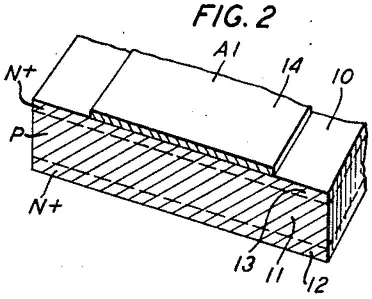
Figure 3:
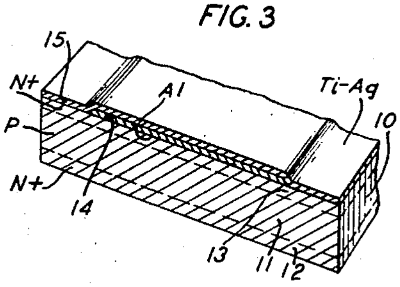
Figure 4:
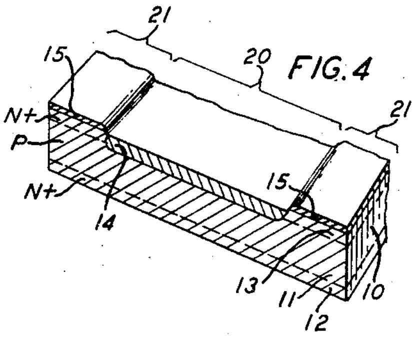

Referring to FIG. 5(*a*), in one specific embodiment the method begins following diffusion of a donor impurity, typically phosphorus, into a slice of p-type silicon semiconductor material. The semiconductor slice is divided ultimately into several wafers having a size suitable for device fabrication, for example, into a solar cell. Generally, the following described metal deposition and heating operations are done on the material in slice form. However, for convenience in describing the invention, the process will be described as applied to a solar cell size wafer. After preliminary processing, and as shown in FIG. 1, the wafer 10 has two thin n-type skins 12 and 13, one on each surface with a major intermediate p-type region 11 therebetween. For a solar cell, these are about .25 micron in depth.

On one surface of the wafer which is to be the reverse or unilluminated surface, a wide central strip 14 of aluminum is vapor deposited to a film thickness of about 8000 Angstroms. Films having a thickness of from 8000 to 10,000 Angstroms appear particularly advantageous. The bare portions along each edge define the areas where it is desired to apply solder.

Both surfaces of the wafer then are coated with titanium and silver in accordance with the aforementioned application, the front or active surface, not shown, being masked to produce a comb-like array for making contact to the shallow, diffused n-type layer. In accordance with (*c*) of FIG. 5, the layer 15 of the titanium-silver combination on the reverse side is applied to the entire surface. As indicated in 5(*d*), the entire assembly next is heated to a temperature of about 615 degrees centigrade for a period of about five minutes. Generally, temperatures in the range from 600 degrees centigrade to 620 degrees centigrade have been found satisfactory with the higher temperature being more desirable from the standpoint of forming the titanium-sliver electrode. During this heat treatment, the aluminum layer 14 alloys through n-type skin and into the major p-type region 11 and also alloys with the titanium-silver layer above it to form an untinnable alloy in the central portion 20 of FIG. 4. Over the edge portions 21, on the other hand, the titanium-silver coating alone bonds to the silicon and does enable tinning. Finally, the wafer is dip soldered in a bath comprising about 38 percent lead, 60 percent tin, 2 percent silver and a fractional percentage, about 0.2 percent, antimony. This solder does not "tin" the aluminum-containing portion 20 as noted heretofore, but does adhere to portions 21.

Thus, after this step, the wafer has solder on the back surface only on those portions not originally coated with aluminum. The aluminum-containing layer makes low resistance contact to the p-type region 13 of the body. Thus, electrical contact to the p-type region exists through the aluminum alloy portion, the aluminum-bearing layer and into the contiguous titanium-silver solder portions. In this fashion, the aluminum coating functions as a self-masking arrangement to inhibit the application of solder to parts of the surface where it is unnecessary and may be deleterious.

Although the invention has been disclosed in terms of a specific embodiment, it will be understood that other arrangements may be devised by those skilled in the art which likewise will be within its scope and spirit. For example, other metals may be used instead of the titanium-silver combination. Those suggested in the above-noted application by Lepselter include zirconium, niobium, tantalum, thorium and vanadium. Similarly, other solder mixtures may be used.

What is claimed is:

1. In the fabrication of a semiconductor device including a body of silicon semiconductor material the method of making a large area low resistance contact to a region of one conductivity type underlying a thin diffused surface region of opposite conductivity type which includes the steps of depositing on a portion of the surface of said thin diffused region a layer of aluminum leaving bare those portions of said surface upon which electrodes are to be applied, depositing on said entire surface and overlaying said aluminum layer a layer of electrode metal, and heating said body at an elevated temperature for a few minutes, said elevated temperature being sufficiently high to enable alloying of said aluminum with said electrode metal and said semiconductor material and below that at which said aluminum and said electrode metal evaporate.

2. In the fabrication of a semiconductor device including a body of silicon semiconductor material the method of making a large area low resistance contact to a region of one conductivity type underlying a thin diffused surface region of opposite conductivity type which includes the steps of depositing on a portion of the surface of said thin diffused region a layer of aluminum leaving bare those portions of said surface upon which electrodes are to be applied, depositing on said entire surface and overlaying said aluminum layer a layer of titanium and silver, and heating said body at an elevated temperature for a few minutes, said elevated temperature being sufficiently high to enable alloying of said aluminum with said titanium and silver and said semiconductor material and below that at which said aluminum and said titanium and silver evaporate.

3. In the fabrication of a semiconductor device including a body of silicon semiconductor material the method of making a large area low resistance contact to a region of one conductivity type underlying a thin diffused surface region of opposite conductivity type which includes the steps of depositing on a portion of the surface of said thin diffused region a layer of aluminum leaving bare those portions of said surface upon which electrodes are to be applied, depositing on said entire surface and overlaying said aluminum layer a layer of electrode metal, and heating said body at about 615 degrees centigrade for about five minutes, whereby the aluminum alloys through the thin diffused surface conductivity type region and simultaneously forms an untinnable mixture with said electrode metal.

4. In the fabrication of a semiconductor device including a body of silicon semiconductor material the method of making a large area low resistance contact to a region of one conductivity type underlying a thin diffused surface region of opposite conductivity type which includes the steps of depositing on a portion of the surface of said thin diffused region a layer of aluminum leaving bare those portions of said surface upon which electrodes are to be applied, depositing on said entire surface and overlaying said aluminum layer a layer of titanium and silver, and heating said body at about 615 degrees centigrade for about five minutes.

5. In the fabrication of a semiconductor device including a body of silicon semiconductor material the method of making a large area low resistance contact to a region of one conductivity type underlying a thin diffused surface region of opposite conductivity type which includes the steps of depositing on a portion of the surface of said thin diffused region a layer of aluminum having a thickness of about 8000 Angstroms, leaving bare those portions of said surface upon which electrodes are to be applied, depositing on said entire surface and overlaying said aluminum layer a layer of titanium and sliver, and heating said body at about 615 degrees centigrade for about five minutes, whereby the aluminum alloys through said thin surface conductivity type region and simultaneously forms an untinnable mixture with the titanium-silver coating.

References Cited by the Examiner

UNITED STATES PATENTS 2,897,588 8/1959 Chapman ---------- 117—38 X

RICHARD D. NEVIUS, *Primary Examiner.*

W. L. JARVIS, *Assistant Examiner.*